(12) United States Patent
Grayson et al.

(10) Patent No.: US 6,748,419 B2
(45) Date of Patent: *Jun. 8, 2004

(54) SYSTEM AND METHOD FOR SOLID MODELING

(75) Inventors: J. Paul Grayson, Garland, TX (US); Stephen Perry Emmons, Jr., Plano, TX (US)

(73) Assignee: Alibre, Inc., Richardson, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/392,493

(22) Filed: Sep. 9, 1999

(65) Prior Publication Data

US 2003/0078974 A1 Apr. 24, 2003

Related U.S. Application Data

(60) Provisional application No. 60/109,792, filed on Nov. 25, 1998.

(51) Int. Cl.[7] .................. G06F 15/16; G06T 15/00; G06T 17/00
(52) U.S. Cl. ............... 709/205; 709/214; 345/419; 345/420
(58) Field of Search ................ 709/105, 106, 709/205, 213, 214, 217, 313, 237; 345/418–427

(56) References Cited

U.S. PATENT DOCUMENTS

| | | | | |
|---|---|---|---|---|
| 5,339,247 A | * | 8/1994 | Kirihara et al. ............. 700/106 |
| 5,379,374 A | * | 1/1995 | Ishizaki et al. ............. 345/759 |
| 5,506,964 A | * | 4/1996 | Beukema .................... 709/201 |
| 5,561,790 A | * | 10/1996 | Fusaro ......................... 703/26 |
| 5,687,317 A | * | 11/1997 | Hughes et al. .............. 709/205 |
| 5,724,508 A | * | 3/1998 | Harple et al. ............... 709/205 |
| 5,815,683 A | * | 9/1998 | Vogler ......................... 709/217 |
| 5,818,469 A | * | 10/1998 | Lawless et al. ............. 345/522 |
| 5,887,170 A | * | 3/1999 | Ansberry et al. ........... 709/204 |
| 5,907,494 A | * | 5/1999 | Dangelo et al. ................ 703/1 |
| 5,923,573 A | * | 7/1999 | Hatanaka ....................... 703/2 |
| 5,987,242 A | * | 11/1999 | Bentley et al. ............... 703/13 |
| 5,995,097 A | * | 11/1999 | Tokumine et al. .......... 345/752 |
| 6,020,885 A | * | 2/2000 | Honda ......................... 345/757 |
| 6,151,621 A | * | 11/2000 | Colyer et al. ............... 345/2.1 |
| 6,158,903 A | * | 12/2000 | Schaeffer et al. ........... 709/204 |
| 6,201,546 B1 | * | 3/2001 | Bodor et al. ................ 345/420 |
| 6,233,600 B1 | * | 5/2001 | Salas et al. .................. 709/201 |
| 6,397,117 B1 | * | 5/2002 | Burrows et al. ............... 700/97 |
| 2001/0051984 A1 | * | 12/2001 | Fukasawa ................... 709/205 |

* cited by examiner

Primary Examiner—David Wiley
Assistant Examiner—George Neurauter
(74) Attorney, Agent, or Firm—Jenkens & Gilchrist, a Professional Corporation

(57) ABSTRACT

Modeling three-dimensional objects on a computer system via a high bandwidth distributed network, facilitating the computing of intensive computer-aided design (CAD) tasks to take place on a series of servers. A multi-tiered distributed processing architecture, which separates client user interface, multiple application servers and database servers is employed, resulting in the separation of server computing and data storage from the client control device. Computing for CAD tasks is directed to the client device or to an application server, as is appropriate for the complexity of tasks being performed.

20 Claims, 5 Drawing Sheets

SYSTEM AND METHOD FOR SOLID MODELING

PRIORITY STATEMENT UNDER 35 U.S.C. §119 & 37 C.F.R. §1.78

This nonprovisional application claims priority based upon the following prior U.S. Provisional Patent Application and U.S. patent application:

| Ser. No. | FILING DATE | TITLE | INVENTOR |
|---|---|---|---|
| 60,109,792 | Nov. 25, 1998 | System and Method for Solid Modeling on the Internet | Shriver et al. |

BACKGROUND OF THE PRESENT INVENTION

1. Field of the Invention

The present invention relates to the field of three-dimensional (3-D) solid modeling for mechanical engineers/designers. More specifically, the present invention is directed to a system and method accessing computer applications and servers to manage distributed processing related to 3-D solid modeling for mechanical engineers/designers.

2. Description of the Related Art

The visualization of three-dimensional objects on a computer screen has enabled designers to model real world physical objects without the need to actually create the object. Using the enhanced computer graphics capabilities of current computers, designers can model an increasing variety of objects in various circumstances. For example, mechanical engineers in the automotive and aeronautical engineering disciplines can model discrete parts, collections of parts or whole assemblies on the computer. Physical testing and many other performance models can also be modeled and visualized prior to the actual creation of the part, thereby saving significant production and experimentation costs.

Current solid modeling products are individual-productivity applications, focusing on individual engineers using, for example, standalone Windows NT or UNIX workstations rather than high-bandwidth distributed networks. Such programs focus on facilitating the three-dimensional visualization of solid models, complex mathematical geometry and constraint calculations, and also provide for consistent storage of this type of data for recurring use involving creation and change. To do this, applications must be able to accept input, validate input, construct data or make changes, use input to perform changes on the existing data model, and then display that model. In conventional computing platforms, this is all accomplished using one machine, e.g., a standalone workstation, with the participants using the application directly. The distinction between visualization, internal calculations and storage of data is intertwined and, for performance reasons, has heretofore been considered to be best practice.

Due in part to the constraints of these prior computing platforms, existing solid modeling programs have few features and limited support for team or collaborative activities. Thus, supporting engineering team collaboration in the design and manufacturing process and effectively managing changes has been virtually impossible.

Further, current computer aided design (CAD) systems require a large internal corporate infrastructure to support the hardware, software and networks required for such a system to function properly. If a company requires interaction with outside suppliers or clients, an even larger commitment to corporate infrastructure is required to deal with the many additional complexities to network with an external entity.

Several technological advances, such as the proliferation of inexpensive PCs, the acceptance of TCP/IP as an universal communications standard, fast routers and the increase in bandwidth of Asynchronous Digital Subscriber Line (ASDL) technology and cable modems, have now made high-bandwidth distributed networks, such as the Internet, a viable computing platform. The development of a program that takes advantage of these improvements on the Internet or within an intranet offers not only a more effective way to provide access to applications and data, but also facilitates more robust processing and computations by efficiently distributing those activities to the devices and servers best suited for those tasks. Further, the effective use of the Internet/intranet as a computing platform diminishes the necessity for companies to maintain large complex corporate infrastructures by clearing the way for outsourcing of those activities to service providers.

It is, therefore, an object of the present invention to facilitate three-dimensional modeling in a pervasive computing environment.

SUMMARY OF THE INVENTION

The present invention provides a method and system for three-dimensional solid modeling for mechanical engineers/designers in a distributed processing high-bandwidth network. The platform has essentially three components: the design application, the design server and the repository server. These components are all preferably coordinated by an administrative server. In preferred embodiments, the design application is resident on each user's local machine, the design server and repository server can be on one machine, the design and repository servers can each be on respective individual machines, or multiple instances of each may be on many machines. The configuration of components is primarily driven by user needs and related tasks. Thus, the present invention will be seen to 1) provide increased processing efficiencies by directing specific processing tasks to the machine or machines best suited for those tasks; and 2) provide increased options for corporate infrastructure investment by allowing the outsourcing of any or all of the components of the platform and their maintenance.

According to a preferred embodiment of the method of the present invention, an input, such as a change request, is entered in the design application. That input is validated by the design application to determine if it: is a well-formed request. If a well-formed change request, that request is submitted to the design server. The design server performs the change and reports the results of the change back to the design application. If successful, the design application updates the information it stores locally and provides a visual representation of the results of the changes to the user. In this example, the design application makes the determination of what it needs from the server to subsequently display to the user. However, the present invention preferably takes advantage of the resources of multiple machines while prior art is restricted to the bandwidth of a single system.

A more complete appreciation of the present invention and the scope thereof can be obtained from the accompanying drawings which are briefly summarized below, the following detailed description of the presently-preferred embodiments of the invention, and the appended claims.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
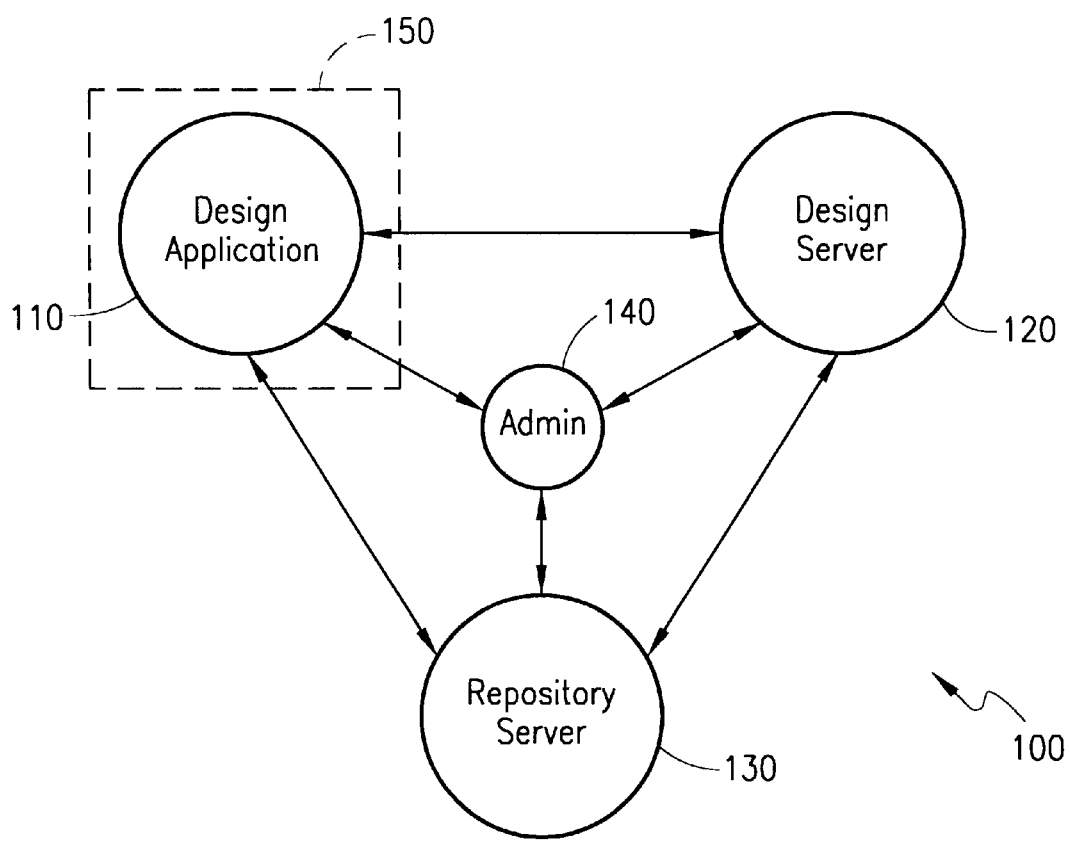
FIG. 1 illustrates a first embodiment of the present invention.

With reference now to FIG. 1 of the Drawings, a first embodiment of the present invention includes a multi-tier, distributed processing architecture, generally designated therein by the reference numeral 100. As illustrated in FIG. 1, a design application 110 is in communication with a design server 120, a repository server 130 and an administrative node 140, where each of the representative nodes 110, 120, 130 and 140 are in communication with each other.

It should be understood that design application 110 is a graphical user interface, e.g., a computer modeling system or workstation having the requisite display device(s) for the visualization of model data thereon and sufficient remote connections, e.g., to the nodes 120, 130 and 140, to effectuate remote design, e.g., via TCP/IP or other protocols. In a currently preferred embodiment, said design application 110 is written in the JAVA programming language. A primary function of said design application 110 is to provide a link to the user, more specifically to provide a visual representation of the three-dimensionally rendered objects, to formulate requests to server-based designs and receive via point-of-contact data sent from any server back to the design application 110. It should be understood that the design application 110 is executed on the individual user's local system, generally designated by the reference numeral 150 shown in outline, and is always present whenever a user is accessing any part of the current invention.

Design server 120 includes a session managing program and the respective modeling data for one or more concurrent design applications 110, as well as a 3-D solids modeling kernel and a 2-D/3-D constraint management system, as is understood in the art. The software within the design server 120 is preferably written in JAVA and C++, and has, as a primary function, to process requests from respective design applications 110, create 3-D solids models, process changes to 3-D solids models, and to provide a source for accessing data for the visualization functions of the respective design applications 110. A primary distinction between the 3-D visualization capabilities of the design application 110 and the 3-D modeling kernel capabilities of the design server 120, is that whereas the design application 110 displays simplistic representations or 3-D visualizations, the modeling kernel of the design server 120 creates and handles more complex geometric, topological and mathematical calculations of the same data.

With reference again to FIG. 1, the aforementioned repository server 14 includes a hierarchical organization of inter-related data files, as is understood in the art. As with the design server 120, the repository server 130 is preferably written in JAVA and C++. A primary function of the repository server 130 is to maintain persistent storage of solids modeling data between invocations of design sessions generated by a number of users, e.g., either a lone designer or a team of designers in a collaborative design project.

With final reference to FIG. 1, the aforementioned administrative node 140, coordinating activities between the physical equipment and software at nodes 110, 120 and 130, provides network administration services supplied by a host operating system. It should be understood that the administrative node 140 is utilized as is normal for any networked system. However, for purposes of clarity, it will not always be singled out or described further herein.

It should be understood that the design application 110, the design server 120, and the repository server 130 may be connected by high bandwidth networks, such as a local area network, the Internet, an intranet or any combination of these or other networking systems. It should further be understood that although each tier illustrated in FIG. 1 is separate, high bandwidth processing is attainable by delineating between the types of processing that will occur by the different tiers. Each tier preferably has bi-directional access to each of the other tiers, as well as to the administrative node 140.

Figure 2:
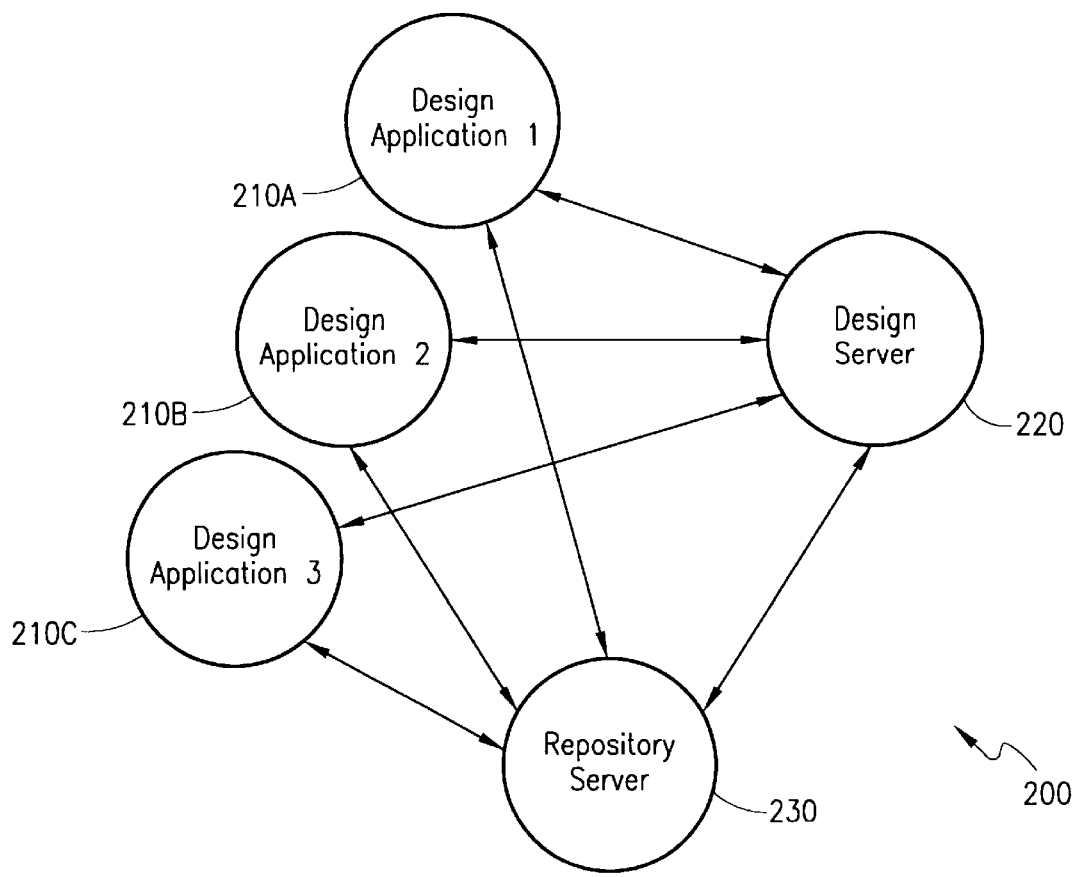
FIG. 2 illustrates a variation of the embodiment shown in FIG. 1 having multiple design applications.

With reference now to FIG. 2, there is illustrated another embodiment of the present invention in which multiple users in a distributed processing architecture, generally designated therein by the reference numeral 200, access each of the other tiers via separate instances of respective design applications 210A, 210B and 210C. Each of design applications 210A, 210B and 210C may obtain data that has been updated on a design server 220 and/or on a repository server 230, as discussed in connection with FIG. 1.

Figure 3:
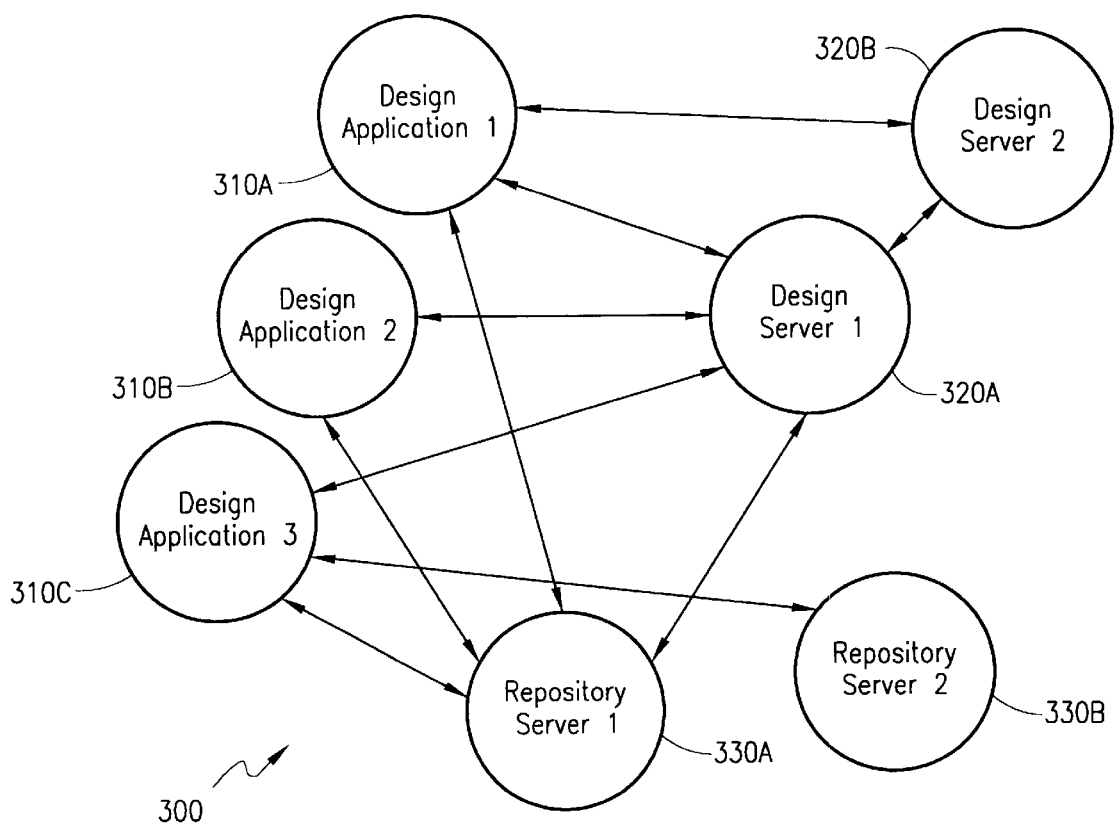
FIG. 3 illustrates another variant of the embodiment shown in FIG. 1 having multiple design applications, design servers and repository servers.

With reference now to FIG. 3, a further embodiment of the present invention is illustrated in a configuration that contains multiple design applications 310P, 310B and 310C, multiple design servers 320A and 320B, and multiple repository servers 330A and 330B in a distributed architecture 300. In this embodiment, multiple users via their individual design applications 310A, 310B and 310C may access any design server 320A and 320B, and/or data from any repository server 330A and 330B. The design servers 320A and 320B may also access data from any repository server 330A and 330B. Further, it is possible that design servers 320A and 320B may access each other on an as needed basis when it is necessary to off-load some processing.

Figure 4:
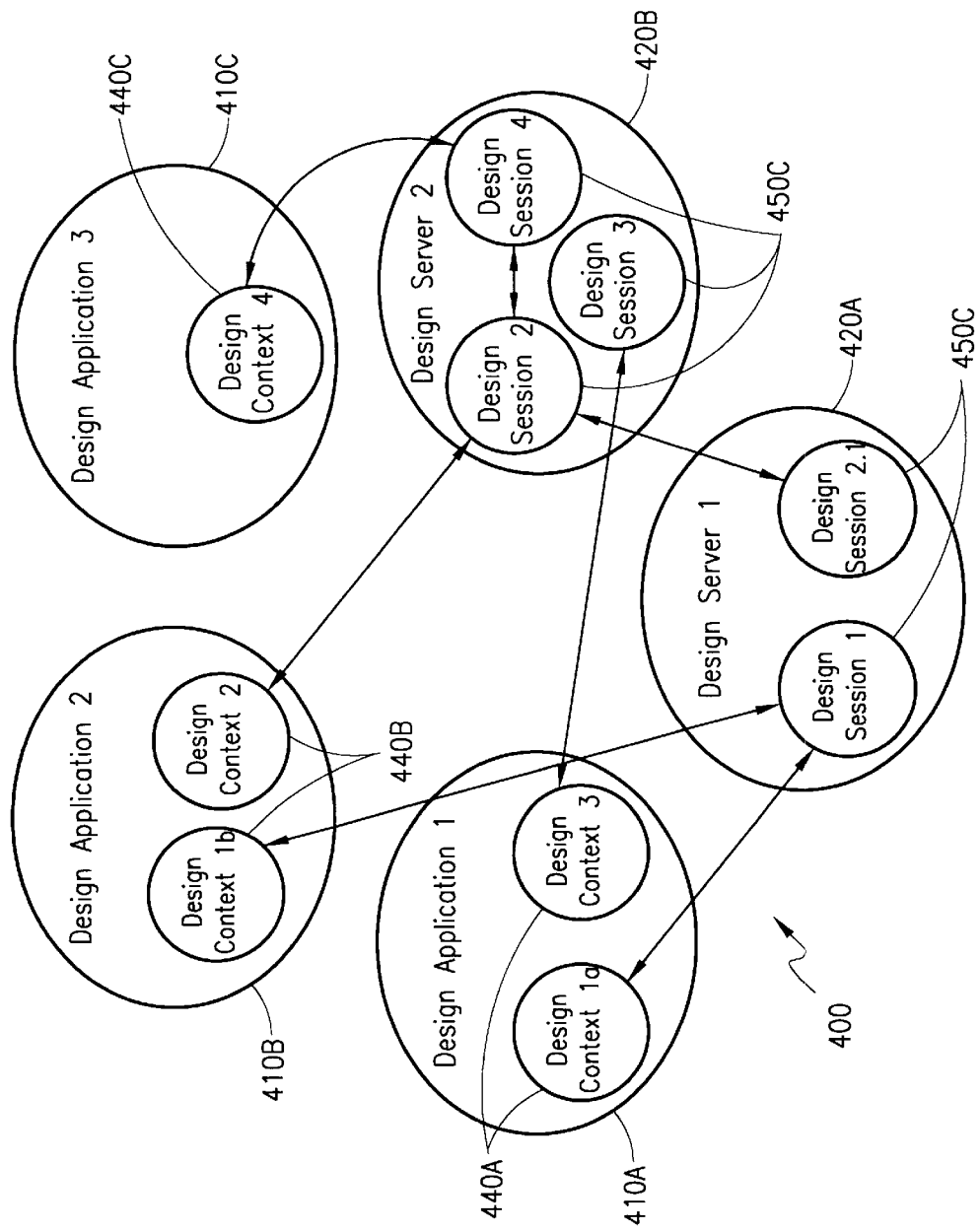
FIG. 4 illustrates exemplary relationships between design applications and design servers.

With reference now to FIG. 4, there is illustrated another distributed architecture, generally designated by the reference numeral 400, having a number of design sessions and contexts on respective design applications 410A, 410B and 410C and design servers 420A and 420B. For example, a design context 440A is a collection of data on design application 410A that references a remote design session, e.g., Design Context 1a to Design Session 1 on design server 420A and Design Context 3 to Design Session 3 on design server 420B, and uses proxies of the data of the respective session. As further shown in FIG. 4, the design applications 410A, 410B and 410C have a many-to-many relationship with the respective design servers 420A and 420B. Design contexts 440A, 440B and 440C have a many-to-one relationship with the respective design sessions 450C. Design sessions 450C have a many-to-one relationship with the respective design servers 420A and 420B. With reference now to design server 420B, a design session 450C therein (design session 2) can reference other design sessions 450C on its own design server 42 (design session 4) or other design sessions 450 on other design servers, e.g., design session 450C on design server 420A (design session 2.1).

With further reference to FIG. 4, it should be understood that various sessional embodiments are illustrated therein. For example, a single design context having a single design session corresponding thereto, e.g., design context 440A (design context 3) in design application 410A to design session 450C (design session 3) on design server 420B. Alternatively, a single design context 440A (design context 1a) of design application 410A may share a design session 450C (design session 1 in design server 420A) with another design context 440B (design context 1b) of another design application 410B. Further, a single design context 440C (design context 4) on design application 410C may reference one of many design sessions 450C on a design server 420B, e.g., design session 4.

Figure 5:
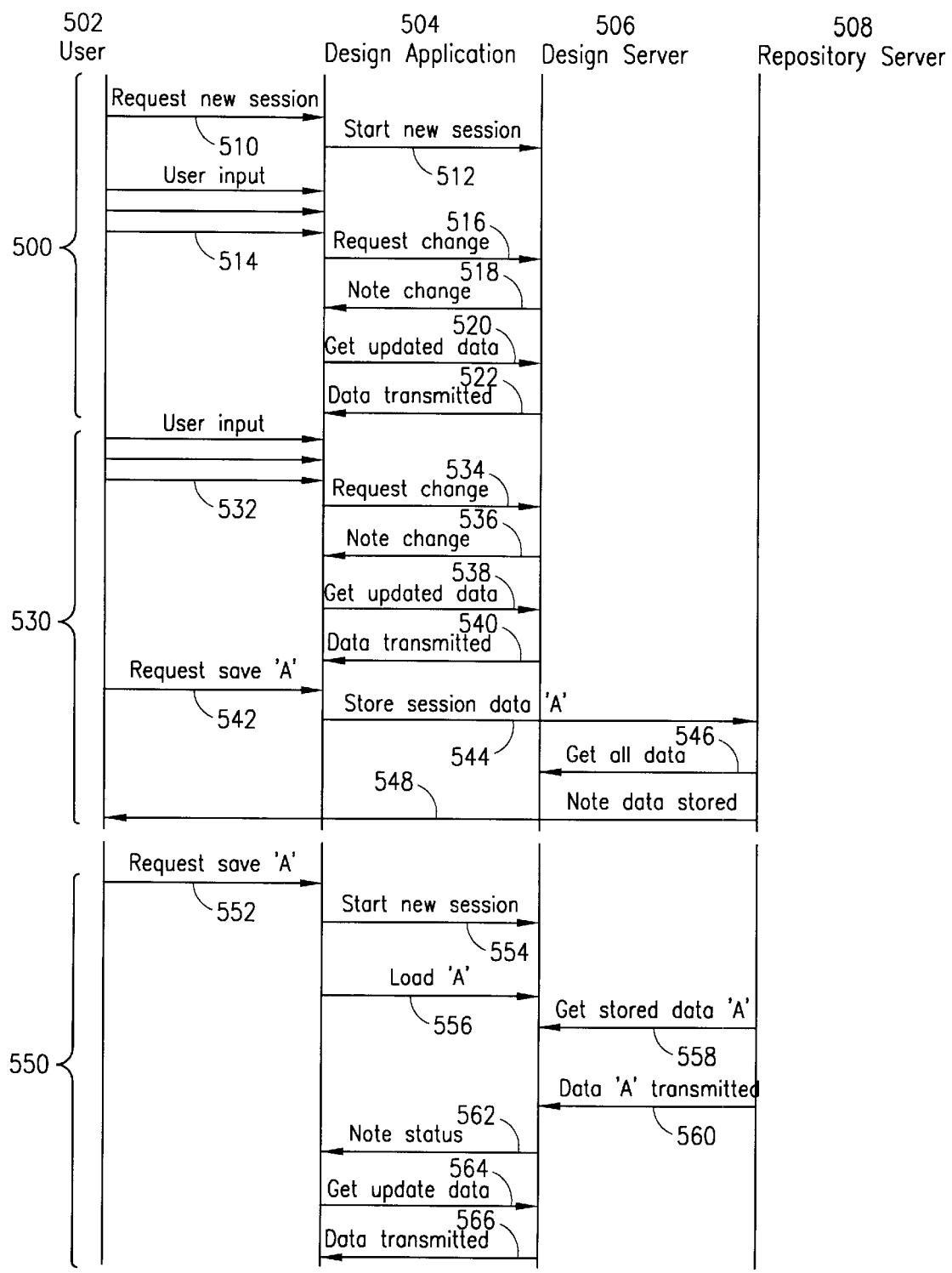
FIG. 5 illustrates exemplary procedures and timelines for practicing the principles of the present invention.

With reference now to FIG. 5, there is illustrated a procedure for implementing the principles of the present invention, particularly the various ordered instructions between the user and the aforedescribed tiers. A first interaction, generally designated by the reference numeral 500, illustrates various steps at the start of a session. At the beginning of a new session, a user 502 logs on, requesting a new session (step 510) via a design application 504, which asks a design sever 506 to create a new session (step 512). The user 502 commences working, providing user input (steps 514) that is validated by the design application 504 which in turn makes the determination to request a change from the design server 506 (step 516). The design server 506 asynchronously returns a notice (step 518) to the design application 504 that a change was completed. The design application 504 then gets the required data from the design server 506 (step 520). When the request is satisfied (step 522), the design application 504 notifies the user 502 by providing the visualization of the results.

In a second interaction, generally designated by the reference numeral 530, the aforedescribed process repeats with the user 502 providing inputs (step 532), e.g., a request change (step 534), asynchronous notice (step 536) obtaining updated data (step 538) and transmission of the data (step 540), which the user 502 then sees. The above steps may be repeated a number of times until the user 502 decides to save and finish session (step 542). When prompted by the user 502, the design application 504 sends the request to save data to a repository server 508 (step 544). The repository server 508 obtains the updated data from the design server 506 (step 546), and stores the new data 'A'. A notification is returned from the repository server 508 to the user 502 that the data was stored (step 548).

Later, in a third interaction, generally designated by the reference numeral 550, the user 502 may wish to start a new session using the aforedescribed stored data A. The user 502 begins by opening 'A' (step 552) at which time the design application 504 starts a new session (step 554) with the design server 506, followed by a request to the design server 506, followed by a request to the design server 506 to load 'A' (step 556). The design server 506 requests the stored data 'A' from the repository server 508 (step 558), which transmits the data 'A' (step 560). The design server 506 sends a notification of status to the design application 504 (step 562) at which time the design application 504 requests the updated data from the design server 506 (step 564). The design server 506 then transmits the data to the design application 504 (step 566), which is then made visible to the user 502.

The previous description is of a preferred embodiment for implementing the invention, and the scope of the invention should not necessarily be limited by this description. The scope of the present invention is instead defined by the following claims.

What is claimed is:

1. A computer modeling system for modeling three-dimensional objects, said system comprising:

a display node for displaying at least one model of a given three-dimensional object based on received solids modeling data, a user of said display node employing a graphical user interface to manipulate said at least one model;

a design node, in communication with said display node, for calculating the solids modeling data used for the displaying of said at least one model of said given three-dimensional object pursuant to instructions from said user;

a repository node, in communication with said design node and said display nodes, for storing the solids modeling data for said at least one model of said given three-dimensional object; and a networking connection supporting bi-directional communications among and between each of the display node, design node and repository node.

2. The computer modeling system according to claim 1, wherein a plurality of display nodes are in bi-directional communication with each other and said design node over the networking connection.

3. The computer modeling system according to claim 2, wherein said plurality of display nodes bi-directionally communicate with each of a plurality of repository nodes over the networking connection.

4. The computer modeling system according to claim 1, further comprising:

a second design node in bi-directional communication with each of said display node, said design node and repository node over the networking connection, whereby said user employs said graphical user interface to manipulate another model.

5. The computer modeling system according to claim 1, wherein said design node coordinates the displaying of a plurality of models of three-dimensional objects.

6. The computer modeling system according to claim 1, wherein said design node coordinates the displaying of said at least one model with at least one other design node over the networking connection.

7. The computer modeling system according to claim 1, wherein said design node is in communication with a plurality of repository nodes.

8. The computer modeling system according to claim 1, further comprising:
an administrative node in bi-directional communication with each of said graphical user interface at said display node, said design node and said repository node over the networking connection, whereby said administrative node coordinates bi-directional communications among and between the display node, the design node, and the repository node.

9. The computer modeling system according to claim 1, wherein said design node is on the Internet.

10. The computer modeling system according to claim 1, wherein said display node accesses a plurality of respective design nodes on the Internet.

11. A computer modeling system, comprising:
a repository node storing solids modeling data relating to a plurality of three-dimensional object models;
a plurality of user display nodes each operating to visualize solids modeling data and produce three-dimensional object model images;
a server node including a session manager function that manages concurrent modeling design sessions with each of the plurality of user display nodes and further includes a modeling function for manipulating solids modeling data at user request for each modeling design session; and
a networking interconnection for supporting bi-directional communication of solids modeling data among and between each of the repository node, the plurality of user display nodes and the server node.

12. The system of claim 11 wherein the modeling function handles geometric, topological and mathematical calculations relating to the solids modeling data.

13. The system of claim 11 wherein the networking connection is an Internet connection.

14. The system of claim 11, further comprising:
an administrative node connected by the network interconnection to the display nodes, the design node and said repository node and operable to coordinate communications among and between the display nodes, the design node and the repository node.

15. The system of claim 14 wherein the coordination of communications relates to the establishment of the design node sessions.

16. A computer modeling system, comprising:
a plurality of user display nodes each operating to visualize solids modeling data and produce three-dimensional object model images;
a first server node including a session manager function that manages modeling design sessions with the plurality of user display nodes and further includes a modeling function for manipulating solids modeling data at user request for each modeling design session;
the display nodes including:
a first display node implementing a first design context with respect to a first modeling design session being handled by the first server node; and
a second display node implementing a second design context with respect to the same first modeling design session; and
a networking interconnection for supporting communication among and between the plurality of user display nodes and each server node.

17. The system of claim 16 further including a second server node including a session manager function that manages modeling design sessions with the plurality of user display nodes and further includes a modeling function for manipulating solids modeling data at user request for each modeling design session;
the first display node implementing a third design context with respect to a second modeling design session being handled by the second server node.

18. The system of claim 16 further including a third modeling design session being handled by the first server node, the first and third modeling design sessions communicating with each other in the first server node with respect to the manipulation of solids modeling data.

19. The system of claim 18 further including a third display node implementing a third design context with respect to the same third modeling design session.

20. The system of claim 16 further including a third server node including a session manager function that manages modeling design sessions with the plurality of user display nodes and further includes a modeling function for manipulating solids modeling data at user request for each modeling design session; and
further including a fourth modeling design session being handled by the third server node, the first and fourth modeling design sessions communicating with each other between the first server node and third server node with respect to the manipulation of solids modeling data.

* * * * *